United States Patent
Freed

Patent Number: 6,128,477
Date of Patent: Oct. 3, 2000

[54] SYSTEM FOR IMPROVING THE DYNAMIC RANGE OF TRANSMITTER POWER MEASUREMENT IN A CELLULAR TELEPHONE

[75] Inventor: John G. Freed, Raleigh, N.C.

[73] Assignee: Ericsson Inc., Research Triangle Park, N.C.

[21] Appl. No.: 09/131,135

[22] Filed: Aug. 7, 1998

[51] Int. Cl.⁷ .................................................... H04B 1/02
[52] U.S. Cl. .......................... 455/115; 455/126; 455/127; 375/295; 330/279
[58] Field of Search .................................. 455/115, 126, 455/127, 129, 91, 117; 375/216, 295, 297, 312; 330/85, 97, 129, 140, 141, 278, 285, 291, 279

[56] References Cited

U.S. PATENT DOCUMENTS

| | | |
|---|---|---|
| 5,172,071 | 12/1992 | Braathen . |
| 5,196,806 | 3/1993 | Ichihara . |
| 5,371,473 | 12/1994 | Trinh et al. . |
| 5,832,373 | 11/1998 | Nakanishi et al. ....................... 455/126 |
| 5,852,770 | 12/1998 | Kasamatsu ............................... 455/126 |
| 5,896,064 | 4/1999 | Kaku ........................................ 455/126 |
| 5,960,333 | 9/1999 | Repke et al. ............................. 455/126 |
| 6,034,999 | 3/2000 | Kirisawa .................................. 455/126 |
| 6,038,432 | 3/2000 | Onoda ..................................... 455/127 |

FOREIGN PATENT DOCUMENTS 0843420  5/1998  European Pat. Off. .

*Primary Examiner*—Reinhard J. Eisenzopf
*Assistant Examiner*—Lester G. Kincaid
*Attorney, Agent, or Firm*—Wood, Phillips, VanSanten, Clark & Mortimer

[57] ABSTRACT

An improved power output control circuit is used in a mobile station having a transmitter including a transmitter variable gain amplifier developing an RF output signal applied to an antenna. The improved power output control circuit includes a detector circuit for rectifying an input signal to produce a DC output representing power level of the input signal. A sampling circuit is connected to the transmitter and the detector circuit for alternately connecting and disconnecting the RF signal from the transmitter to the detector circuit, whereby the detector circuit develops an alternating DC output signal. A variable gain AC amplifier is coupled to the detector circuit for amplifying the detector output. A gain control circuit is coupled to the AC amplifier for receiving the amplified detector output and comparing it to a select reference to develop a feedback signal used to vary gain of the AC amplifier to maintain a desired constant output level, the feedback signal representing transmitter output power. A comparator compares the feedback signal to a control reference to control gain of the transmitter variable gain amplifier.

20 Claims, 2 Drawing Sheets

SYSTEM FOR IMPROVING THE DYNAMIC RANGE OF TRANSMITTER POWER MEASUREMENT IN A CELLULAR TELEPHONE

FIELD OF THE INVENTION

This invention relates to power output control circuits for mobile cellular telephone systems and, more particularly, to a system for improving the dynamic range of transmitter power measurement in a cellular telephone.

BACKGROUND OF THE INVENTION

A mobile cellular telephone includes a transmitter developing an RF output signal applied to an antenna. It is desirable to control the power output to the minimum level necessary to maintain reliable communications. This minimizes interference among users and maximizes battery lifetime.

Present cellular telephone systems sample the transmitted RF signal and compare it to a DC control voltage known to correspond to a specific transmitter power level. A difference signal is fed back to a gain control transmitter stage to adjust the power up or down as required to achieve the desired power output. Correlation between the DC control voltage and the RF output power is established in a calibration procedure performed as part of the manufacturing test process. The phone is set to transmit known power levels, generally low, medium, and high power, and the detector voltage is read and stored into non-volatile memory as a digital word. This procedure may be repeated at several frequencies across the operating band. Values in between calibration points may be interpolated by software to produce intermediate power outputs.

A typical detector circuit uses a diode for rectifying the RF signal to a DC signal proportional to the power output. To improve sensitivity of the diode detector, a DC bias current is often passed through the diode. This overcomes the threshold voltage of the diode, improving detection at low signal levels. However, due to the temperature dependence of the diode's PN junction, the output voltage from the detector varies over temperature. As the detected power level decreases, the measurement becomes less accurate because the temperature dependent offset voltage becomes a larger portion of the detector's DC output voltage. To overcome the temperature dependence of the detector diode, schemes have been proposed using an identical diode to cancel the temperature varying voltage. However, exact matching is difficult, and as the detected power decreases, the inaccuracy increases.

The present invention is directed to overcoming the above problems in a novel and simple manner.

SUMMARY OF THE INVENTION

In accordance with the invention there is provided a system and method for improving the dynamic range of transmitter power measurement in a cellular telephone.

Broadly, there is disclosed herein an improved power output control circuit used in a mobile station having a transmitter including a transmitter variable gain amplifier developing an RF output signal applied to an antenna. The improved power output control circuit includes a detector circuit for rectifying an input signal to produce a DC output representing the power level of the input signal. A sampling circuit is connected to the transmitter and the detector circuit for alternately connecting and disconnecting the RF signal from the transmitter to the detector circuit, whereby the detector circuit develops an alternating DC output signal. A variable gain AC amplifier is coupled to the detector circuit for amplifying the detector output. A gain control circuit is coupled to the AC amplifier for receiving the amplified detector output and comparing it to a select reference to develop a feedback signal used to vary the gain of the AC amplifier to maintain a desired constant output level, the feedback signal representing transmitter output power. A comparator compares the feedback signal to a control reference to control gain of the transmitter variable gain amplifier.

It is a feature of the invention that the detector circuit comprises a diode detector circuit. A bias circuit passes a DC bias current through the detector circuit to improve sensitivity of the detector circuit. A coupling capacitor connects the detector circuit to the sampling circuit to isolate the DC bias from the sampling circuit. A further coupling capacitor connects the detector output to the variable gain AC amplifier to remove detector bias voltage from the alternating DC output signal.

It is another feature of the invention that the sampling circuit comprises a switch controlled by a clock circuit.

It is a further feature of the invention that the gain control circuit comprises an analog to digital converter that converts high and low analog values of the alternating DC output signals to digital values. The gain control circuit comprises a programmed processor circuit. The programmed processor circuit compares a magnitude difference between the high and low digital values to the select reference, and the feedback signal represents the result of the comparison. A digital to analog converter connected between the programmed processor circuit and the variable gain AC amplifier converts the feedback signal to an analog signal.

There is disclosed in accordance with another aspect of the invention a method of controlling output power in a mobile station having a transmitter including a transmitter variable gain amplifier developing an RF output signal applied to an antenna. The method comprises the steps of alternately operating a switch to connect and disconnect the RF signal from the transmitter to a voltage detector for developing an alternating DC output signal, amplifying the alternating DC output signal, comparing the amplified alternating DC signal to a select reference to develop a feedback value, the feedback value representing transmitter output power, varying gain of the amplified alternating DC signal based on the feedback value to maintain a desired constant AC amplifier output level, and controlling gain of the transmitter variable gain amplifier using the feedback value.

It is an object of the invention to provide a power output control circuit which does not need temperature compensation of a detector diode.

It is another object of the invention to provide a power output control circuit having the ability to measure low power levels more accurately than the prior art.

It is another object of the invention to provide a power output control circuit which avoids saturation when making high power measurements by using a variable gain amplifier as an attenuator.

It is still a further object of the invention to provide a power output control circuit in which dynamic range of power measurement is set by gain and control ranges of the variable gain AC amplifier.

Further features and advantages of the invention will be readily apparent from the specification and from the drawing.

DETAILED DESCRIPTION OF THE INVENTION

Figure 1:
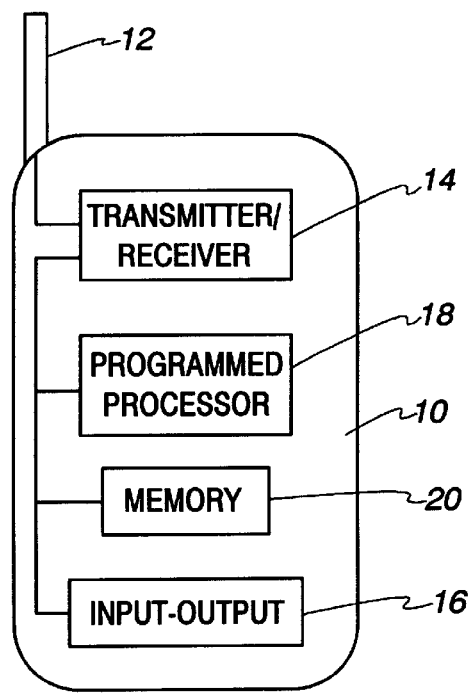
FIG. 1 is a generalized block diagram illustrating a mobile station including a power output control circuit according to the invention.

FIG. 1 is a generalized block diagram of a typical mobile station (also called a wireless telephone, cellular telephone, or cell phone), shown generally at 10. The mobile station 10 includes an antenna 12 for sending and receiving radio signals between itself and a wireless network. The antenna 12 is operatively connected to a transmitter/receiver circuit 14 to broadcast and receive signals using the same antenna 12. As is conventional, the receiver part of the transmitter/receiver 14 demodulates, demultiplexes and decodes radio signals into one or more channels. These channels include a control channel and a traffic channel for speech or data. The speech may be delivered to an input/output device 16, including a speaker (not shown). Messages from the control channel are delivered to a programmed processor 18 which uses an associated memory 20. The programmed processor 18 controls and coordinates the functioning of the mobile station 10 responsive to messages on the control channel using programs and data stored in the memory 20 to operate within the wireless network. The processor 18 also controls operation of a transmitter portion of the transmitter/receiver 14. The transmitter converts analog electrical signals into digital data, encodes the data with error detection and correction information, and multiplexes this data with control messages from the processor 18. The transmitter modulates this combined data stream and broadcasts the resultant radio RF signal to the wireless network using the antenna 12.

Figure 2:
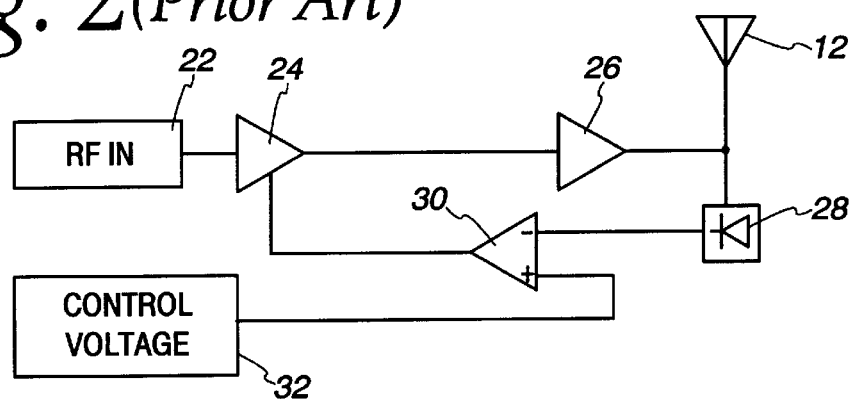
FIG. 2 is a schematic diagram of a prior art power output control circuit.

Referring to FIG. 2, a schematic diagram illustrates a power detection circuit used with a transmitter of a mobile station, such as the mobile station 10. An RF input signal at a block 22 is developed by a transmitter portion of the transmitter/receiver 14. The RF input signal is amplified by a variable gain amplifier 24 and subsequently a power amplifier 26 before being applied to the antenna 12. A sample of the output power from the power amplifier 26 is converted to a DC output by a diode detector circuit 28. The diode detector circuit is connected to the negative input of a DC differential amplifier 30. A control voltage from a block 32 is applied to the plus input of the DC amplifier 30. The control voltage corresponds to a known power level. The DC amplifier 30 drives the voltage difference between its input terminals to zero by adjusting the gain of the variable gain amplifier 24 in the transmit path. When zero volts is present across the differential amplifier input terminals, the output power has been adjusted to the proper level as determined by the control voltage at the block 32. The output power may be set to another value by changing the control voltage at the block 32. Typically, the DC voltage settings corresponding to particular output powers are determined in production tests and stored in non-volatile memory.

Although not shown, the analog portion of the power control loop can be replaced with a digital circuit using analog to digital and digital to analog converters connected to a programmed processor, such as the processor 18 of FIG. 1.

Figure 3:
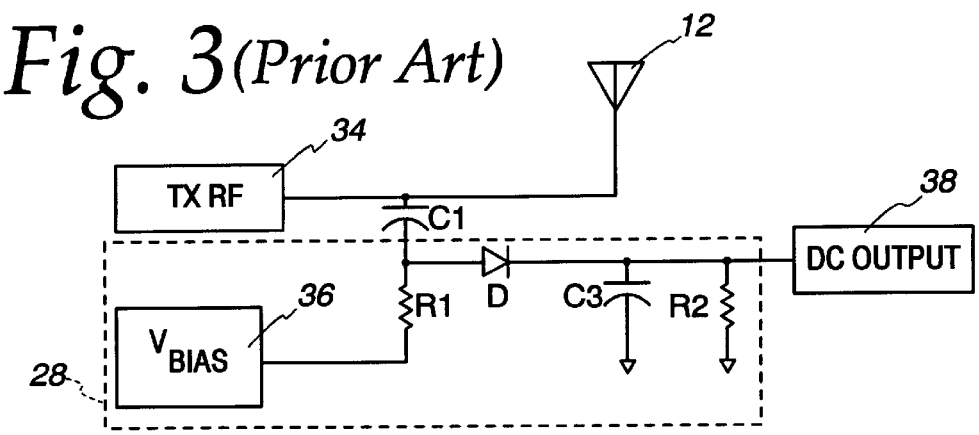
FIG. 3 is a schematic drawing of a prior art diode detector circuit used with a power output control circuit.

Referring to FIG. 3, the diode detector 28 is illustrated in greater detail. A transmit RF block 34 represents the output of the power amplifier 26 in FIG. 2. The output of the block 34 is connected via a coupling capacitor C1 to the diode detector circuit 28. A bias voltage from a block 36 is connected through a resistor R1 to the coupling capacitor C1. A diode D is connected to the junction of the capacitor C1 and the resistor R1. The diode D develops a DC output at a block 38 corresponding to the signal applied to the DC amplifier 30 in FIG. 2. The DC output 38 is made up of an offset or bias term equal to the product of the bias current times the detector resistor R1 and another term proportional to the RF power. A filter consisting of a resistor R2 and capacitor C3 filter the RF from the detector output, leaving only the DC component. Due to the temperature dependence of the diode D, the output voltage at the block 38 varies over temperature. As the detected power level decreases, the measurement becomes less accurate because the temperature-dependent offset voltage becomes a larger proportion of the detector's DC output voltage.

In accordance with the invention a power output control circuit needs no temperature compensation of the detector diode, has the ability to measure low power levels, avoid saturation making high power measurements, and provides improved dynamic range.

Figure 4:
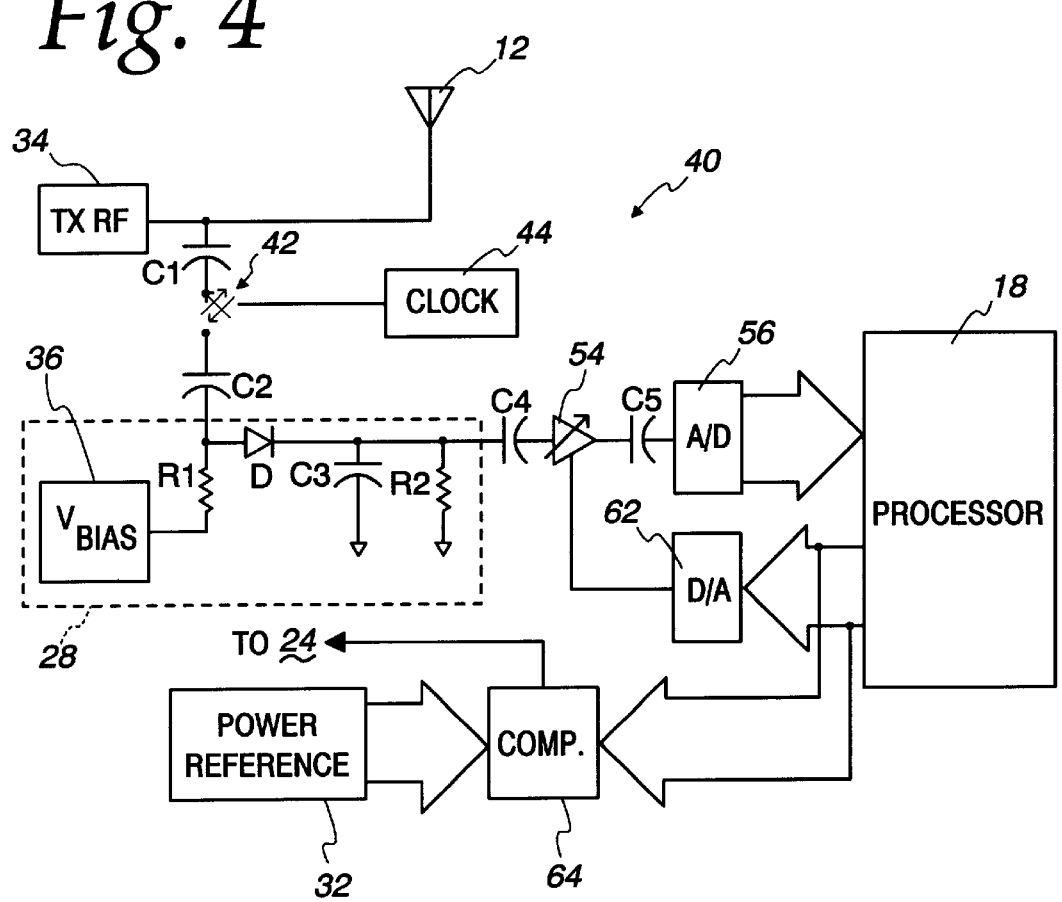
FIG. 4 is a schematic diagram/block diagram illustrating the improved power output control circuit according to the invention.

Referring to FIG. 4, a power output control circuit 40 according to the invention is illustrated. The power output control circuit is used in a mobile station, such as the mobile station 10 of FIG. 1, having a transmitter including a transmitter variable gain amplifier 24, see FIG. 2, developing an RF output signal applied to an antenna 12. The signal applied to the antenna 12 is represented at the transmit RF block 34, similar to that in FIG. 3, based on a control voltage or power reference at a block 32, similar to FIG. 2.

For simplicity, elements corresponding to those discussed above relative to FIGS. 2 and 3 are illustrated with like reference numerals.

A portion of the transmit signal from the block 34 is sampled via the coupling capacitor C1. The coupling capacitor could be replaced by other means, such as a microstrip or strip line coupler. A switch 42 is connected to the coupling capacitor C1. The switch 42 is controlled by a clock 44. The switch 42 alternately connects and disconnects the sampled transmit signal to and from the detector circuit 28. This is done repetitively at a predetermined rate. A plurality of small gallium arsenide switches can be used to implement the functions of the switch 42.

Figure 5:
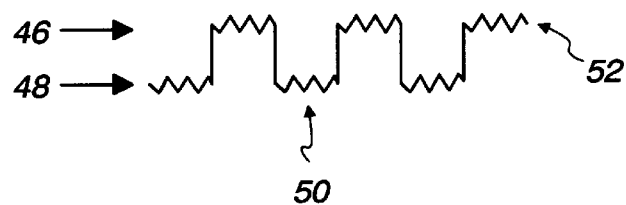
FIG. 5 is a curve illustrating an output of a detector circuit of FIG. 4.

The detector circuit 28 is biased by the resistors R1 and R2 along with an external DC voltage from the bias block 36. A capacitor C2 is connected between the detector circuit 28 and the switch 42. The capacitor C2 isolates the DC bias from the switch 42 to prevent any interaction between the bias voltage and the switching function. The DC voltage across the R2/C3 filter is equal to the bias voltage when the switch 42 is off, and is equal to the sum of the bias voltage plus the detected RF signal when the switch is on. Because the switch operates repetitively, i.e., it is clocked, the voltage across the R2/C3 filter is a an alternating DC output signal in the form of a square wave, as illustrated in FIG. 5.

Particularly, the portions where the switch is on are represented at a DC level 46 and the portions when the switch 42 is off are represented at a DC level 48. The lower portions of the square wave, representing the detector bias voltage, are referenced at 50, while the upper portions of the square wave, representing the detector bias voltage and the detected RF voltage, are referenced at 52. The oscillations represent noise.

Figure 6:
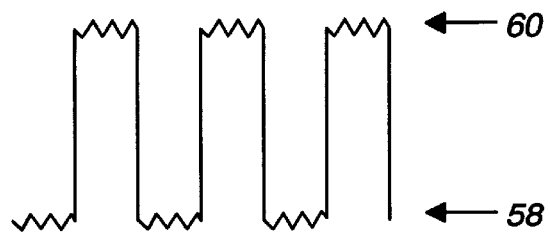
FIG. 6 is a curve illustrating an output of an amplifier circuit of FIG. 4.

A coupling capacitor C4 connects the DC output of the detector circuit 28 to an AC variable gain amplifier 54. The coupling capacitor C4 removes the detector bias voltage from the alternating DC output signal. The AC component of the detector voltage is amplified by the variable gain amplifier 54. The output of the variable gain amplifier 54 is connected via a capacitor C5 to an analog to digital (A/D) converter 56. The A/D converter 56 samples the square wave output of the amplifier at its minimum, representing the no signal value, and its maximum, representing the signal present value, and supplies these signals to the processor circuit 18. The amplifier output voltage is illustrated at FIG. 6. The processor 18 takes the difference between the two measurements, i.e., no RF signal at the detector as shown at a level 58 in FIG. 6 and RF signal present at the detector, as shown at a level 60 in FIG. 6.

The processor 18 is connected to a digital to analog (D/A) converter 62 having an analog output connected to the AC variable gain amplifier 54. The processor 18 takes the difference between the two measurement levels, represented at 58 and 60 in FIG. 6, and determines if the difference is below a predetermined level. If so, then the gain of the amplifier 54 is increased by increasing the feedback value to the D/A converter 62 to thus increase the feedback signal. If the measured difference is above the predetermined level, then the gain of the amplifier 54 is reduced by decreasing the feedback value, and thus the feedback signal. The objective is to provide a fixed level out of the AC variable gain amplifier 54 by using feedback to control the gain. The result of comparing the output of the A/D converter 56 to the reference level is to either increase or decrease the digital word at the input of the D/A converter 62 and correspondingly either increase or decrease the gain of the AC variable gain amplifier 54.

While the feedback gain control is illustrated using digital circuitry, these functions could be implemented with other circuits, such as an analog automatic gain control loop controlling the gain of the amplifier 54, as will be apparent.

The feedback value supplied to the D/A converter 62 is a representation of the detector voltage, which in turn is a representation of transmitter output power. This digital word, or a corresponding analog voltage applied to the variable gain amplifier 54, is supplied to a comparator 64 to compare to the reference level from the block 32 representing a particular power level which was stored in the phone's memory during the factory calibration process. From this comparison an error signal is fed back to the gain control stage of the variable gain transmit amplifier 24, see FIG. 2, in the transmit path to achieve power control. Again, this function can be performed either in the digital or analog domain.

The AC variable gain amplifier 54 and converters 56 and 62 could be integrated into a single chip for a relatively small, inexpensive implementation of this circuit.

By choosing the AC variable gain amplifier characteristics properly, low level detection problems of a DC coupled detector are eliminated because the DC bias component is removed from the measurement and there is sufficient gain available to achieve full-scale A/D range. Likewise, the measurement of high levels is improved because the variable gain amplifier can be adjusted to attenuate the detected signal, if necessary, to achieve full scale A/D range.

Thus, by using an AC variable gain amplifier, a power output control circuit is provided which operates at low power levels. This eliminates uncertainties in the detector circuit where it is difficult to separate the bias signal from the desired signal. The use of chopping of the sampled signal allows the temperature varying DC bias to be removed.

In accordance with the invention the dynamic range of the transmitter power measurement is equal to the range of the controlled gain of the AC variable gain amplifier 54.

I claim:

1. In a mobile station having a transmitter including a transmitter variable gain amplifier developing an RF output signal applied to an antenna, an improved power output control circuit comprising:

a detector circuit for rectifying an input signal to produce a DC output representing power level of the input signal;

a sampling circuit connected to the transmitter and the detector circuit for alternately connecting and disconnecting the RF signal from the transmitter to the detector circuit, whereby the detector circuit develops an alternating DC output signal;

a variable gain AC amplifier coupled to the detector circuit for amplifying the detector output;

a gain control circuit coupled to the AC amplifier for receiving the amplified detector output and comparing it to a select reference to develop a feedback signal used to vary gain of the AC amplifier to maintain a desired constant output level, the feedback signal representing transmitter output power; and a comparator for comparing the feedback signal to a control reference to control gain of the transmitter variable gain amplifier.

2. The improved power output control circuit of claim 1 wherein said detector circuit comprises a diode detector circuit.

3. The improved power output control circuit of claim 2 further comprising a bias circuit for passing a DC bias current through the detector circuit to improve sensitivity of the detector circuit.

4. The improved power output control circuit of claim 3 further comprising a coupling capacitor connecting the detector circuit to the sampling circuit to isolate the DC bias from the sampling circuit.

5. The improved power output control circuit of claim 3 further comprising a coupling capacitor connecting the detector output to the variable gain AC amplifier to remove detector bias voltage from the alternating DC output signal.

6. The improved power output control circuit of claim 1 wherein the sampling circuit comprises a switch controlled by a clock circuit.

7. The improved power output control circuit of claim 1 wherein the gain control circuit comprises an analog to digital converter that converts high and low analog values of the alternating DC output signals to digital values.

8. The improved power output control circuit of claim 7 wherein the gain control circuit comprises a programmed processor circuit.

9. The improved power output control circuit of claim 8 wherein the programmed processor circuit compares a magnitude difference between the high and low digital values to the select reference, and the feedback signal represents a result of said comparison.

10. The improved power output control circuit of claim 9 further comprising a digital to analog converter connected between the programmed processor circuit and the variable gain AC amplifier for converting the feedback signal to an analog signal.

11. A method of controlling output power in a mobile station having a transmitter including a transmitter variable gain amplifier developing an RF output signal applied to an antenna, comprising the steps of:

alternately operating a switch to connect and disconnect the RF signal from the transmitter to a voltage detector for developing an alternating DC output signal;

amplifying the alternating DC output signal;

comparing the amplified alternating DC signal to a select reference to develop a feedback value, the feedback value representing transmitter output power;

varying gain of the amplified alternating DC signal based on the feedback value to maintain a desired fixed amplified alternating DC signal; and controlling gain of the transmitter variable gain amplifier using the feedback value.

12. The method of claim 11 wherein the alternating step includes the step of rectifying the RF signal with a detector circuit.

13. The method of claim 12 further comprising passing a DC bias current through the detector circuit to improve sensitivity of the detector circuit.

14. The method of claim 13 further comprising isolating the DC bias from the switch using a coupling capacitor.

15. The method of claim 13 further comprising remove detector bias voltage from the alternating DC output signal using a coupling capacitor.

16. The method of claim 11 further comprising the step of controlling the switch with a clock.

17. The method of claim 11 further comprising converting high and low analog values of the alternating DC output signal to digital values.

18. The method of claim 17 wherein the comparing step is implemented by a programmed processor circuit.

19. The method of claim 18 wherein the programmed processor circuit compares a magnitude difference between the high and low digital values to the select reference, and the feedback value represents a result of said comparison.

20. The method of claim 19 further comprising converting the feedback value to an analog signal.

* * * * *